United States Patent
Colosimo, Jr. et al.

(10) Patent No.: US 10,468,373 B2
(45) Date of Patent: Nov. 5, 2019

(54) BONDING MACHINES FOR BONDING SEMICONDUCTOR ELEMENTS, METHODS OF OPERATING BONDING MACHINES, AND TECHNIQUES FOR IMPROVING UPH ON SUCH BONDING MACHINES

(71) Applicant: Kulicke and Soffa Industries, Inc., Fort Washington, PA (US)

(72) Inventors: Thomas J. Colosimo, Jr., West Chester, PA (US); Daniel P. Buergi, Chalfont, PA (US); Horst Claubeg, Warwick, PA (US); Matthew B. Wasserman, Philadelphia, PA (US)

(73) Assignee: Kulicke and Sofia Industries, Inc., Fort Washington, PA (US)

( * ) Notice: Subject to any disclaimer, the term of this patent is extended or adjusted under 35 U.S.C. 154(b) by 101 days.

(21) Appl. No.: 15/899,299

(22) Filed: Feb. 19, 2018

(65) Prior Publication Data
US 2018/0174997 A1    Jun. 21, 2018

Related U.S. Application Data

(63) Continuation of application No. 15/228,083, filed on Aug. 4, 2016, now Pat. No. 9,929,121.
(Continued)

(51) Int. Cl.
*B23K 31/02* (2006.01)
*H01L 23/00* (2006.01)
(Continued)

(52) U.S. Cl.
CPC ............ *H01L 24/75* (2013.01); *B23K 1/0016* (2013.01); *B23K 37/04* (2013.01); *H01L 21/6838* (2013.01); *H01L 24/00* (2013.01); *H01L 21/67144* (2013.01); *H01L 2224/751* (2013.01); *H01L 2224/755* (2013.01); *H01L 2224/7565* (2013.01); *H01L 2224/75501* (2013.01);
(Continued)

(58) Field of Classification Search
None
See application file for complete search history.

(56) References Cited

U.S. PATENT DOCUMENTS 4,029,351 A * 6/1977 Apgar .................. B66C 1/0212
                                                            294/64.3
5,169,196 A * 12/1992 Safabakhsh ........ H05K 13/0409
                                                            294/64.3
(Continued)

FOREIGN PATENT DOCUMENTS

DE   102009059936 A1   6/2011
JP       07176569 A    7/1995
(Continued)

OTHER PUBLICATIONS

Machine translation of JP-2012174861-A (no date available).*

*Primary Examiner* — Kiley S Stoner
(74) *Attorney, Agent, or Firm* — Christopher M. Spletzer, Sr.

(57) ABSTRACT

A method of operating a bonding machine is provided. The method includes the steps of: (a) carrying a semiconductor element with a transfer tool; and (b) transferring the semiconductor element from the transfer tool to a bonding tool of the bonding machine without the transfer tool and the bonding tool contacting the semiconductor element at the same time.

14 Claims, 5 Drawing Sheets

Related U.S. Application Data

(60) Provisional application No. 62/212,481, filed on Aug. 31, 2015.

(51) Int. Cl.
  *H01L 21/683* (2006.01)
  *B23K 1/00* (2006.01)
  *B23K 37/04* (2006.01)
  *H01L 21/67* (2006.01)

(52) U.S. Cl.
  CPC .............. *H01L 2224/75803* (2013.01); *H01L 2224/75804* (2013.01); *H01L 2224/75824* (2013.01); *H01L 2224/75981* (2013.01); *H01L 2224/81203* (2013.01); *H01L 2224/83203* (2013.01)

(56) References Cited

U.S. PATENT DOCUMENTS

| | | |
|---|---|---|
| 5,651,495 A | 7/1997 | Tocher et al. |
| 5,792,304 A | 8/1998 | Tamura et al. |
| 6,321,971 B1 | 11/2001 | Jin et al. |
| 6,471,110 B1 | 10/2002 | Luechinger et al. |
| 6,543,668 B1 | 4/2003 | Fujii et al. |
| 2002/0174959 A1* | 11/2002 | Yanagita ............ H01L 21/67092 156/750 |
| 2005/0196897 A1 | 9/2005 | Kuboi |
| 2006/0088625 A1 | 4/2006 | Davis et al. |
| 2006/0102285 A1* | 5/2006 | Bluck ................ H01L 21/67161 156/345.32 |
| 2006/0231202 A1* | 10/2006 | Sakata ................. B29C 63/0013 156/716 |
| 2007/0087279 A1 | 4/2007 | Otsuka |
| 2007/0240751 A1 | 10/2007 | Takahashi |
| 2008/0089768 A1 | 4/2008 | Sakamoto et al. |
| 2008/0164606 A1 | 7/2008 | Greisen et al. |
| 2009/0001133 A1 | 1/2009 | Kuramochi |
| 2009/0127315 A1 | 5/2009 | Okita |
| 2009/0175705 A1* | 7/2009 | Nakao ............... H01L 21/67098 414/196 |
| 2009/0200251 A1 | 8/2009 | Shimizu et al. |
| 2009/0289098 A1 | 11/2009 | Terada et al. |
| 2010/0078125 A1 | 4/2010 | Fujino et al. |
| 2010/0226745 A1* | 9/2010 | Umehara ........... H01L 21/67126 414/752.1 |
| 2011/0035936 A1* | 2/2011 | Lee ......................... H01L 24/75 29/740 |
| 2011/0036897 A1 | 2/2011 | Nakai |
| 2011/0064880 A1* | 3/2011 | Yamamoto .............. C23C 14/50 427/294 |
| 2011/0237028 A1* | 9/2011 | Hamazaki ............ H01L 21/563 438/108 |
| 2012/0127485 A1 | 5/2012 | Yamauchi |
| 2013/0032189 A1 | 2/2013 | Moczygemba et al. |
| 2013/0074873 A1* | 3/2013 | Kitagawa .......... H01L 21/67028 134/6 |
| 2013/0327484 A1* | 12/2013 | Hirakawa ......... H01L 21/67092 156/711 |
| 2014/0076500 A1* | 3/2014 | Honda .............. H01L 21/67092 156/750 |
| 2014/0175159 A1 | 6/2014 | Kostner |
| 2014/0316102 A1* | 10/2014 | Enomoto ............. G01N 33/442 528/421 |
| 2015/0140738 A1* | 5/2015 | Moriyama ............... H01L 24/29 438/113 |
| 2015/0155254 A1 | 6/2015 | Schmidt-Lange et al. |
| 2015/0171049 A1 | 6/2015 | Wasserman et al. |
| 2015/0214085 A1* | 7/2015 | Jin ....................... H01L 21/6838 414/806 |
| 2015/0245549 A1 | 8/2015 | Kurita et al. |
| 2015/0279718 A1* | 10/2015 | Brun ................... H01L 21/6838 156/707 |
| 2015/0321321 A1* | 11/2015 | Kim .................... H01L 21/6838 269/21 |
| 2015/0336221 A1 | 11/2015 | McKay |
| 2015/0364424 A1 | 12/2015 | Golda et al. |
| 2015/0380381 A1 | 12/2015 | Seyama |
| 2016/0005636 A1* | 1/2016 | Ichinose ............. H01L 21/6838 355/30 |
| 2016/0043053 A1 | 2/2016 | Seyama |
| 2016/0141196 A1 | 5/2016 | Chang |
| 2016/0376697 A1* | 12/2016 | Fujinaga ................. C23C 14/50 204/298.09 |
| 2016/0379863 A1* | 12/2016 | Naor ................... H01L 21/6838 414/751.1 |
| 2017/0087680 A1 | 3/2017 | Li et al. |
| 2017/0092613 A1 | 3/2017 | Bilewicz et al. |
| 2017/0154864 A1 | 6/2017 | Hayata et al. |
| 2017/0256434 A1* | 9/2017 | Rashkovsky ....... H01L 21/6838 |
| 2017/0256436 A1* | 9/2017 | Rashkovsky ..... H01L 21/68742 |
| 2017/0263585 A1 | 9/2017 | Homma et al. |
| 2017/0301597 A1* | 10/2017 | Hoshiyama ............... C08F 2/44 |
| 2018/0114714 A1* | 4/2018 | Kim ...................... B65G 47/911 |
| 2018/0301363 A1* | 10/2018 | Chito ................ H01J 37/32091 |
| 2018/0308718 A1* | 10/2018 | Breingan ........... H01L 21/67017 |
| 2018/0308741 A1* | 10/2018 | Breingan ........... H01L 21/68728 |
| 2019/0057891 A1* | 2/2019 | Marinov ................. B32B 37/26 |
| 2019/0198299 A1* | 6/2019 | Watanabe .......... H01J 37/32724 |

FOREIGN PATENT DOCUMENTS

| | | | |
|---|---|---|---|
| JP | 2009124047 A | 6/2009 | |
| JP | 2011151179 A | 8/2011 | |
| JP | 2012174861 A * | 9/2012 | ............ H01L 24/81 |
| JP | 2012174861 A | 9/2012 | |
| WO | WO-2010134643 A2 * | 11/2010 | ......... G03F 7/70691 |
| WO | 2012050096 A1 | 4/2012 | |
| WO | WO-2014084229 A1 * | 6/2014 | ....... H01L 21/67259 |

\* cited by examiner

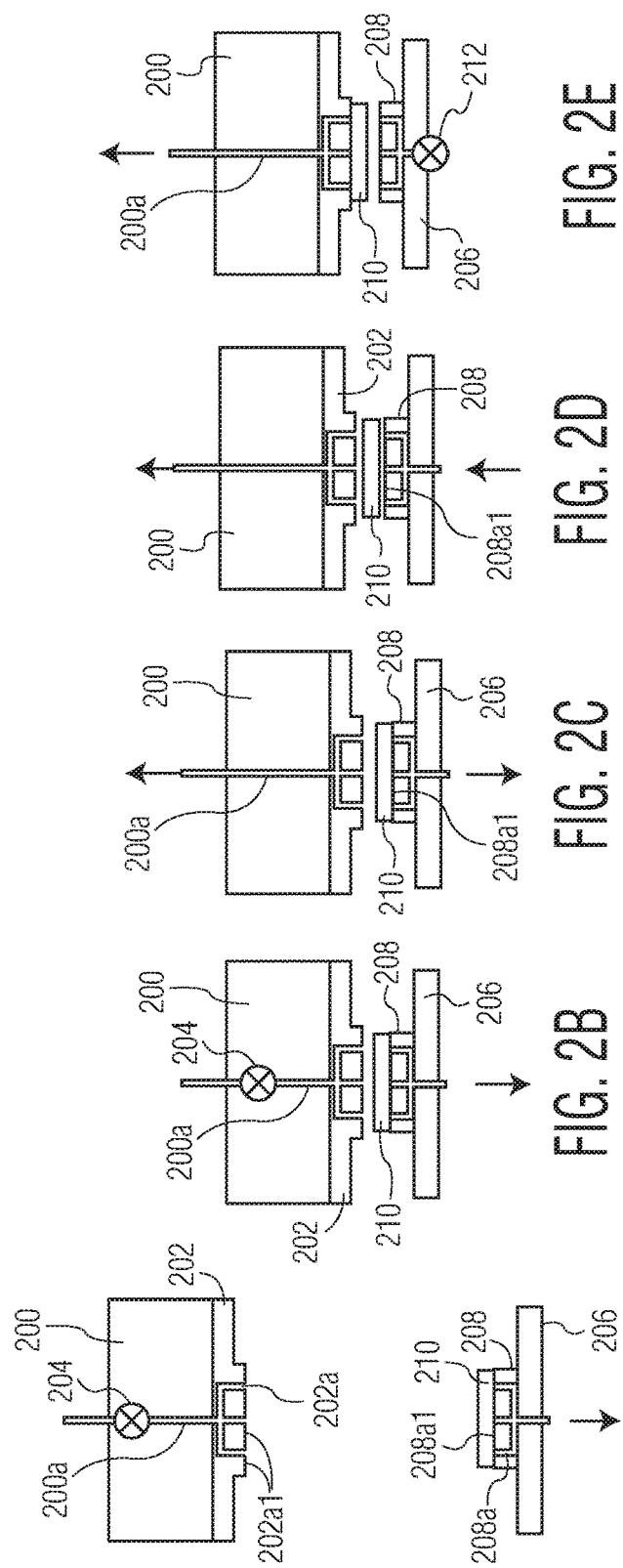

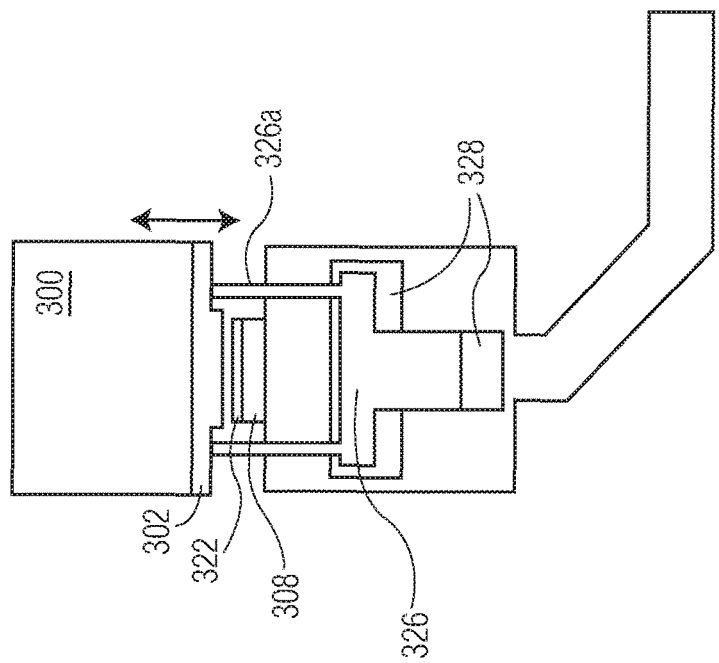
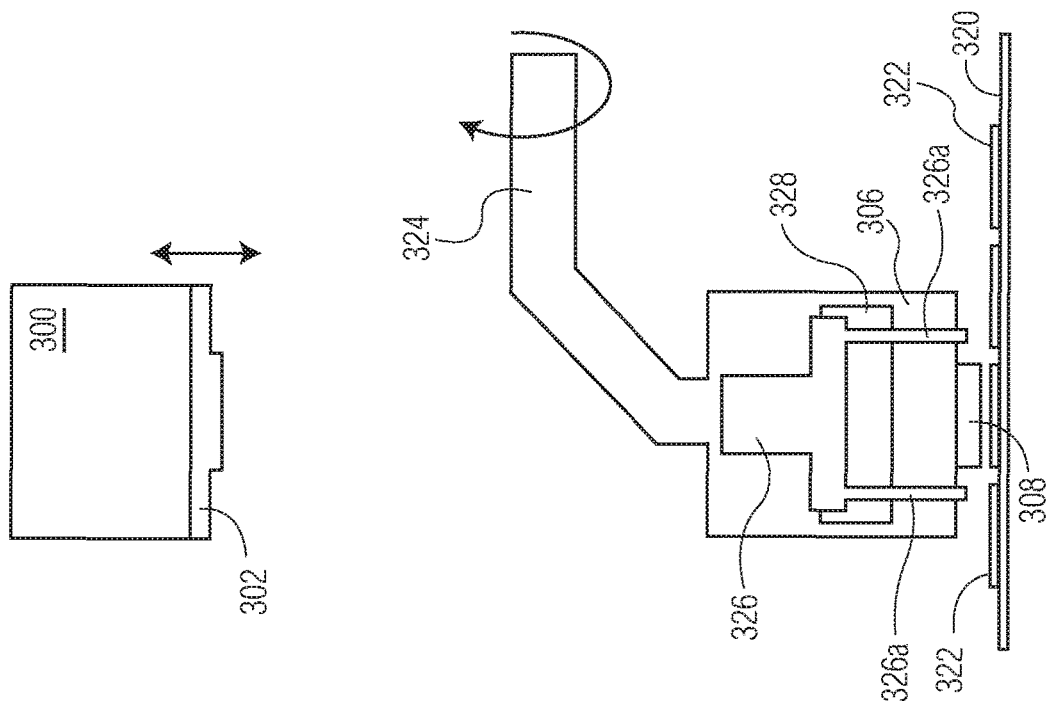
FIG. 3A
FIG. 3B

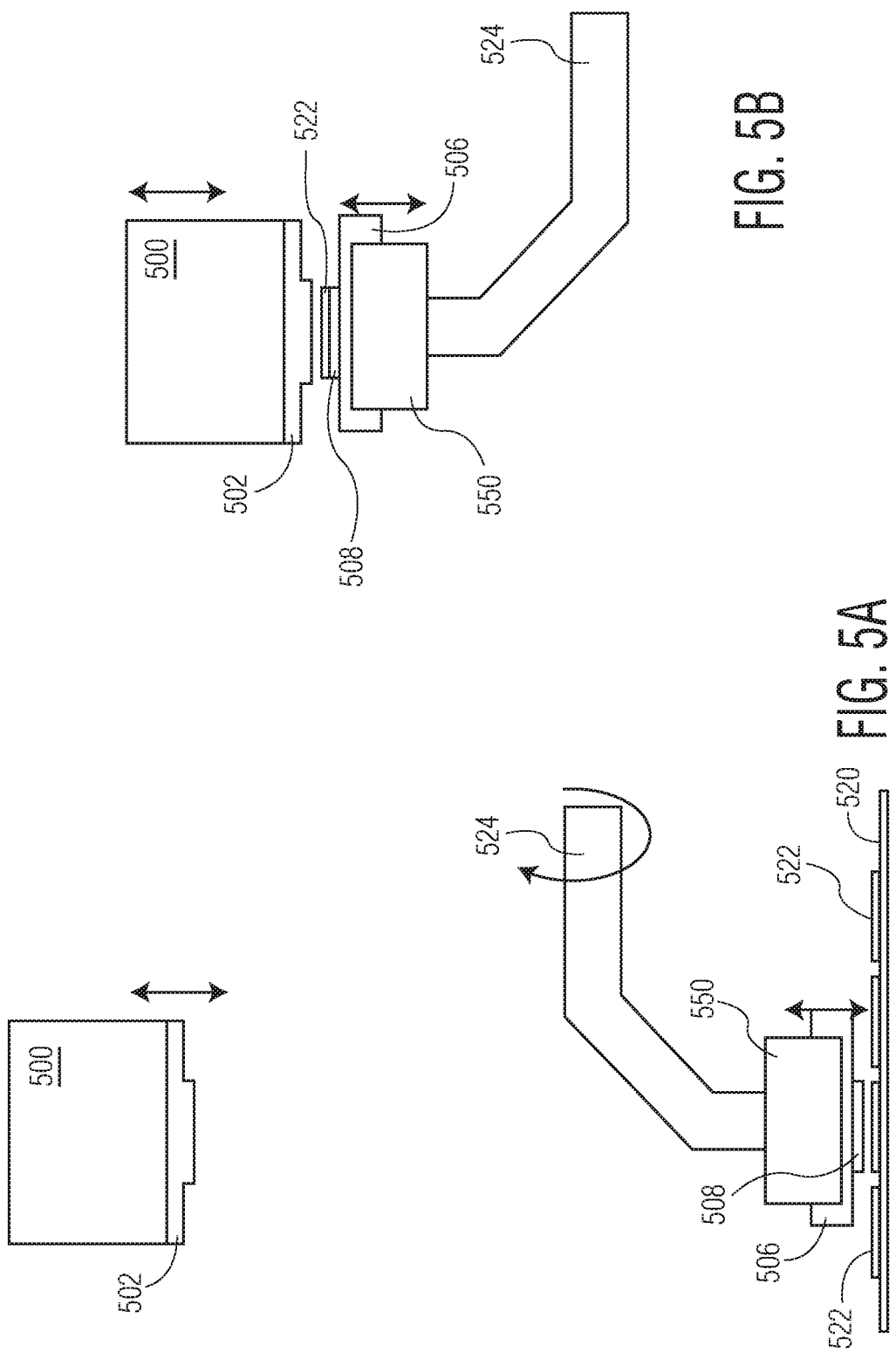

BONDING MACHINES FOR BONDING SEMICONDUCTOR ELEMENTS, METHODS OF OPERATING BONDING MACHINES, AND TECHNIQUES FOR IMPROVING UPH ON SUCH BONDING MACHINES

CROSS-REFERENCE TO RELATED APPLICATION

This application is a continuation application of U.S. patent application Ser. No. 15/228,083, filed Aug. 4, 2016, which claims the benefit of U.S. Provisional Patent Application No. 62/212,481, filed Aug. 31, 2015, the content of which is incorporated herein by reference.

FIELD

The invention relates to the formation of electrical interconnections in semiconductor packages, and more particularly, to improved bonding machines and methods of operating the same.

BACKGROUND

In the semiconductor packaging industry, thermocompression bonding (TCB) includes flip chip processes that are slow to be adopted, and may not be adopted widely, if the productivity of such processes does not improve. Conventional capillary flow underfilling of semiconductor dice is considered not possible on certain devices (e.g., devices having greater than 4 layers). To underfill a semiconductor die during die stacking a "Non Conductive Film" (NCF) may be used. Other commonly used names for NCF are "underfill film" (UF) or "wafer applied underfill film" (WAUF). A challenge with this material is that the film tends to gets "tacky" at relatively low temperatures. Once the film gets tacky the die handover from a transfer tool (e.g., the picker or pick tool) to the place/bonding tool tends to become unreliable. To avoid such handover issues the film temperature at the handover process is desirably at a point well below the temperature where the film starts to be tacky while in contact with the transfer tool; however, this low temperature requires extensive heating and cooling ramps that required time and energy.

Thus, it would be desirable to provide improved bonding machines and methods of operating the bonding machines.

SUMMARY

According to an exemplary embodiment of the invention, a method of operating a bonding machine (e.g., a thermocompression bonding machine which may, or may not, include a heated thermocompression bonding tool) is provided. The method includes the steps of: (a) carrying a semiconductor element with a transfer tool; and (b) transferring the semiconductor element from the transfer tool to a bonding tool of the bonding machine without the transfer tool and the bonding tool contacting the semiconductor element at the same time.

According to another exemplary embodiment of the invention, a bonding machine (e.g., a thermocompression bonding machine which may, or may not, include a heated thermocompression bonding tool) is provided. The bonding machine includes: a bonding tool for bonding a semiconductor element to a substrate; a transfer tool for transferring the semiconductor element to the bonding tool before the semiconductor element is bonded to the substrate; and a gap defining tool for providing a predetermined gap between (a) a contact surface of the bonding tool and (b) a contact surface of the transfer tool, during transfer of the semiconductor element to the bonding tool.

According to yet another exemplary embodiment of the invention, a method of operating a bonding machine (e.g., a thermocompression bonding machine which may, or may not, include a heated thermocompression bonding tool) is provided. The method includes the step of: (a) carrying a semiconductor element with a transfer tool; (b) providing a predetermined gap between (i) a contact surface of the semiconductor element and (ii) a contact surface of a bonding tool, the predetermined gap being provided by a gap defining tool of the bonding machine; and (c) transferring the semiconductor element from the transfer tool to a bonding tool of the bonding machine after step (b).

According to yet another exemplary embodiment of the invention, a bonding machine (e.g., a thermocompression bonding machine which may, or may not, include a heated thermocompression bonding tool) is provided. The bonding machine includes: a bonding tool for bonding a semiconductor element to a substrate; and a transfer tool for transferring the semiconductor element to the bonding tool before the semiconductor element is bonded to the substrate. The transfer tool includes a cooling system for cooling a contact surface of the transfer tool.

According to yet another exemplary embodiment of the invention, a method of operating a bonding machine (e.g., a thermocompression bonding machine which may, or may not, include a heated thermocompression bonding tool) is provided. The method includes the steps of: (a) carrying a semiconductor element with a transfer tool, the transfer tool including a cooling system for cooling a contact surface of the transfer tool; and (b) transferring the semiconductor element from the transfer tool to a bonding tool of the bonding machine after step (a).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 2A-2E are block diagram views illustrating a semiconductor element transfer process in accordance with an exemplary embodiment of the invention where a semiconductor element is transferred from a transfer tool to a bonding tool;

FIGS. 3A-3B are block diagram views of elements of a bonding machine in accordance with an exemplary embodiment of the invention;

FIGS. 5A-5B are block diagram views of elements of a yet another bonding machine in accordance with an exemplary embodiment of the invention.

DETAILED DESCRIPTION

Figure 1E:
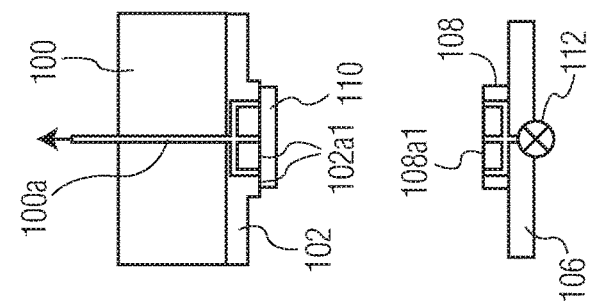
FIGS. 1A-1E are block diagram views illustrating a conventional semiconductor element transfer process where a semiconductor element is transferred from a transfer tool to a bonding tool.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semicondcutor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., an interposer, a spacer to be bonded in a stacked die configuration, a substrate, etc.).

As used herein, the terms "substrate" and "workpiece" are intended to refer to any structure to which a semiconductor element may be bonded (e.g., thermocompressively bonded, flip chip bonded, etc.). Exemplary substrates include, for example, a leadframe, a PCB, a carrier, a semiconductor chip, a semiconductor wafer, a BGA substrate, a semiconductor element, etc.

According to certain exemplary embodiments of the invention, the transfer process (i.e., the transfer from a transfer tool of a bonding machine to a bonding tool of the bonding machine) may be improved by using a non tacky transfer/pick tool (e.g., transfer/pick tools having a contact surface for contacting a semiconductor element formed of a non-tacky material). Non tacky transfer/pick tools will enable higher temperature handovers as the NCF film has less adherence to the transfer/pick tool. The NCF film enables usage of new materials as the film will act as a cushion between (i) the harder, low tacky materials and (ii) the pillars, silicon die on the other side. Examples of materials for low tacky transfer/pick tools (e.g., having a contact surface formed of a non-tacky material) are Teflon® materials, coated rubbers (e.g. parylene), etc.

Further, a low force handover process may be used to reduce film (e.g., NCF) deformation, thereby minimizing the contact area as well as mechanical adhesion to transfer/pick tool. In certain embodiments of the invention, thermal energy may be removed from the film (e.g., NCF) by creating a large thermo-gradient in the die/film stack during the transfer process from the transfer tool to the bonding tool. In a specific application a heated bonding tool contacts the semiconductor element (e.g., a silicon die) whilst the cooled transfer/pick tool touches the NCF film.

According to certain exemplary embodiments of the invention, a high thermo conductive transfer/pick tool may be used. Further, actively cooled transfer/pick tools may be used.

According to further exemplary embodiments of the invention, the handover of the semiconductor element (e.g., the die) may occur without simultaneous contact between the semiconductor element and both the transfer/pick and the bond/place tool.

Using such techniques, a significant UPH improvement is achieved. Desirably, the invention allows for handover/transfer of semiconductor elements with higher bond head temperatures.

Thus, in certain aspects of the invention, a non tacky (e.g., teflon) transfer/pick tool material is used for die transfer/picking, for example, in combination with a "low force", "time optimized" handover process.

In other aspects, the semiconductor elements are transferred to a heated bond/place tool in a non-contact die handover.

Handover/transfer at higher temperatures requires less extensive heat and cooling ramps, thereby significantly increasing bonder UPH.

Referring now to the drawings, FIGS. 1A-1E illustrate elements of a conventional bonding machine and a conventional transfer operation for transferring a semiconductor element 110 between a transfer tool 108 and a bonding tool 102. Prior to the view shown in FIG. 1A, semiconductor element 110 (e.g., a semiconductor die) has been picked from a supply (e.g., a semiconductor wafer), where semiconductor element 110 may have been picked by transfer tool 108, or by a separate pick tool (and then transferred to transfer tool 108). In any event, at FIG. 1A, semiconductor element 110 is held by transfer tool 108 using vacuum or the like. More specifically, transfer tool 108 (which is carried by structure 106 of a bonding machine) defines air/vacuum channels 108a. Using a vacuum pressure through channels 108a (as illustrated by the downward arrow in FIG. 1A), semiconductor element 110 is held onto contact surface 108a1 of transfer tool 108. Bonding tool 102, which defines air/vacuum channels 102a, is carried by bond head assembly 100 (which defines air/vacuum channel(s) 100a, and includes valve 104).

Figure 1D:
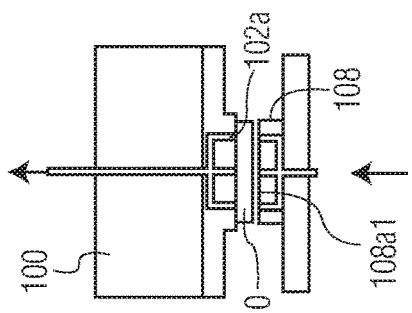
Figure 1C:
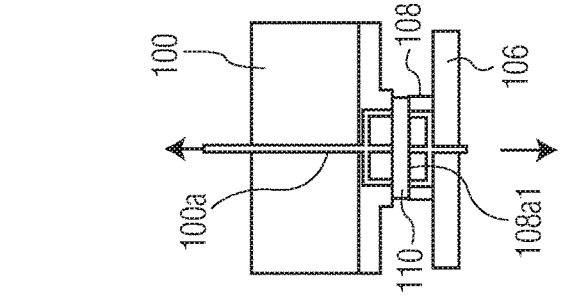
Figure 1B:
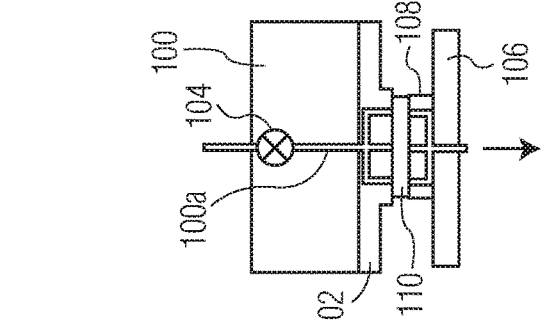
Figure 1A:
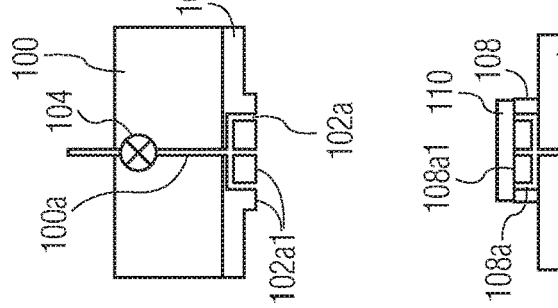

At FIG. 1B, at least one of bonding tool 102 and transfer tool 108 has moved such that contact surface 102a1 of bonding tool 102 is in contact with a side of semiconductor element 110. More specifically, in FIG. 1B, contact surface 108a1 of transfer tool 108 is in contact with a first side of semiconductor element 110, and contact surface 102a1 of bonding tool 102 is in contact with a second side of semiconductor element 110 (opposite the first side of semiconductor element 110). In FIG. 1B, as valve 104 is still closed, there is no vacuum pressure drawn through channels 102a.

In FIG. 1C, valve 104 has been opened, so vacuum pressure is drawn through channels 102a (see arrow pointing upward). In FIG. 1D, vacuum has been removed from channels 108a, and actually has been replaced by positive air pressure (see arrow with changed directions from FIG. 1C to FIG. 1D). In FIG. 1D, vacuum applied in FIG. 1C through channels 102a is still present. Also, in FIG. 1D, relative movement is occurring to separate transfer tool 108 from semiconductor element 110, which is complete in the illustration shown in FIG. 1E. FIG. 1E also illustrates a closed valve 112 shutting off air/vacuum through channels 108a of transfer tool 108. In FIG. 1E, bonding tool 102 may now be used to carry semiconductor element 110 to a bonding location for subsequent bonding. While the process illustrated in FIGS. 1A-1E is conventional in nature, it is also applicable to various aspects of the invention as described below.

In contrast to FIGS. 1A-1E, FIGS. 2A-2E illustrate elements of an inventive transfer operation (e.g., a transfer operation on a thermocompression bonding machine, a flip chip bonding machine, etc.). As will be understood by those skilled in the art, the transfer of a semiconductor element (e.g., a die) may be from a pick tool to the bonding tool, where the pick tool picked the semiconductor element from a semiconductor element source (e.g., a wafer). In another example, the transfer of the semiconductor element may be from an intermediate transfer tool (not the pick tool) to the bonding tool. Thus, a transfer tool may be a pick tool or another transfer tool, but in any event the transfer tool transfers the semiconductor element to the bonding tool (e.g., a heated bonding tool).

FIGS. 2A-2E illustrate a different process compared to FIGS. 1A-1E, because semiconductor element 210 is transferred across a gap (e.g., see FIG. 2D, where the semiconductor element 210 is being transferred without contact with both transfer tool 208 and bonding tool 202 at the same time). Prior to the view shown in FIG. 2A, semiconductor element 210 has been picked from a supply, where semiconductor element 210 may have been picked by transfer tool 208, or by a separate pick tool (and then transferred to transfer tool 208). In any event, at FIG. 2A, semiconductor element 210 is held by transfer tool 208 using vacuum or the like. More specifically, transfer tool 208 (which is carried by structure 206 of the bonding machine) defines air/vacuum channels 208a. Using a vacuum pressure through channels 208a (as illustrated by the downward arrow in FIG. 2A), semiconductor element 210 is held onto contact surface 208a1 of transfer tool 208. Bonding tool 202, which defines air/vacuum channels 202a, is carried by bond head assembly 200 (which defines air/vacuum channel(s) 200a, and includes valve 204).

On a bonding machine, each of bonding tool 202 and transfer tool 208 may have a distinct motion system for moving the respective tool in one or more directions. Such motion systems may move the tools directly, or through a related structure (e.g., bond head 200 carrying bonding tool 202, structure 206 carrying transfer tool 208, etc.). At FIG. 2B, at least one of bonding tool 202 and transfer tool 208 has been moved with their respective motion system (as compared to the positions of FIG. 2A) such that contact surface 202a1 of bonding tool 202 is in close proximity to a side of semiconductor element 210. More specifically, in FIG. 2B, contact surface 208a1 of transfer tool 208 is in contact with a first side of semiconductor element 210, and contact surface 202a1 of bonding tool 202 is in close proximity to (but not in contact with) a second side of semiconductor element 210 (opposite the first side of semiconductor element 210). In FIG. 2B, as valve 204 is still closed, there is no vacuum pressure drawn through channels 202a.

In FIG. 2C, valve 204 has been opened, so vacuum pressure is drawn through channels 202a (as shown by the arrow pointing upward). In FIG. 2D, vacuum has been removed from channels 208a, and actually have been replaced by positive air pressure (see arrow with changed directions from FIG. 2C to FIG. 2D). In FIG. 2D, vacuum applied in FIG. 2C through channels 202a is still present. Also, in FIG. 2D, semiconductor element 210 is drawn by the vacuum pressure drawn through channels 202a to cross the gap between (i) contact surface 202a1 of bonding tool 202 and (ii) contact surface 208a1 of transfer tool 208. That is, semiconductor element is being transferred from transfer tool 208 to bonding tool 202. This transfer may be assisted using the positive air pressure provided through channels 208a present in FIG. 2D. In FIG. 2E, the transfer is now complete, and semiconductor element 210 is carried by bonding tool 202. FIG. 2E also illustrates a closed valve 212 shutting off air/vacuum through channels 208a of transfer tool 208. After FIG. 2E, bonding tool 202 may now be used to carry semiconductor element 210 to a bonding location for subsequent bonding.

Of course, there are variations to the vacuum/air pressure sequence shown in FIGS. 2A-2E within the scope of the invention. In one specific example, vacuum pressure may be pulled through channels 202a on bonding tool 202 prior to the time shown in FIG. 2C, for example, to increase the UPH (units per hours) of machine operation.

In embodiments of the invention where there is a "gap" between (i) a contact surface of the semiconductor element and (ii) a contact surface of the bonding tool, there are various methods contemplated for setting the gap. The "gap" may also be set between (i) a contact surface of the transfer tool and (ii) a contact surface of the bonding tool. In certain exemplary configurations, a mechanical mechanism may be provided to set the gap. FIGS. 3A-3B and FIGS. 4A-4B illustrate examples of such a mechanical mechanism.

In FIG. 3A, a transfer tool 308 (which may be a pick tool) is carried by a structure 306, where structure 306 is carried by a motion system (e.g., including an arm 324) of the bonding machine (where the bonding machine includes the semiconductor element supply source 320, structure 306 carried by the motion system/arm 324, transfer tool 308, a bond head 300, and other elements not shown for simplicity). In FIG. 3A, the motion system (including arm 324) carries the transfer/pick tool 308 to pick a semiconductor element 322 (e.g., a semiconductor die) from supply source 320, and then moves (e.g., flips) such that semiconductor element 322 is facing a bonding tool 302 carried by bond head 300. Structure 306 includes a moving member 326 (such as a piston) that moves within chamber 328 between a retracted position (such as shown in FIG. 3A) and an extended position (such as shown in FIG. 3B). Moving member 326 includes pins 326a that are used to set a gap as shown in FIG. 3B, thereby allowing for contactless transfer of semiconductor element 322 from transfer tool 308 to bonding tool 302. More specifically, after picking a semiconductor element 322 from supply source 320, transfer tool 308 is moved (including a rotative, or flipping, motion as shown in the rotative arrow in FIG. 3A) such that the "picked" semiconductor element 322 is facing bonding tool 302 (as shown in FIG. 3B). Pins 326a are used to set a "gap" between (i) a contact surface of semiconductor element 322 and (ii) a contact surface of bonding tool 302. After the "gap" is set as shown in FIG. 3B, transfer of semiconductor element 322 may be accomplished, for example, using the technique shown in FIGS. 2A-2E. Specifically, bonding tool 302 may have a structure such as bonding tool 202, and transfer tool 308 may have a structure such as transfer tool 208, as shown in FIGS. 2A-2E.

Although FIGS. 3A-3B illustrates a gap defining tool (moving member 326) integrated into structure 306 (or another portion of structure 308), it will be appreciated that such a gap defining tool may be integrated into bonding tool 302 (or another portion of bond head 300).

Figure 4B:
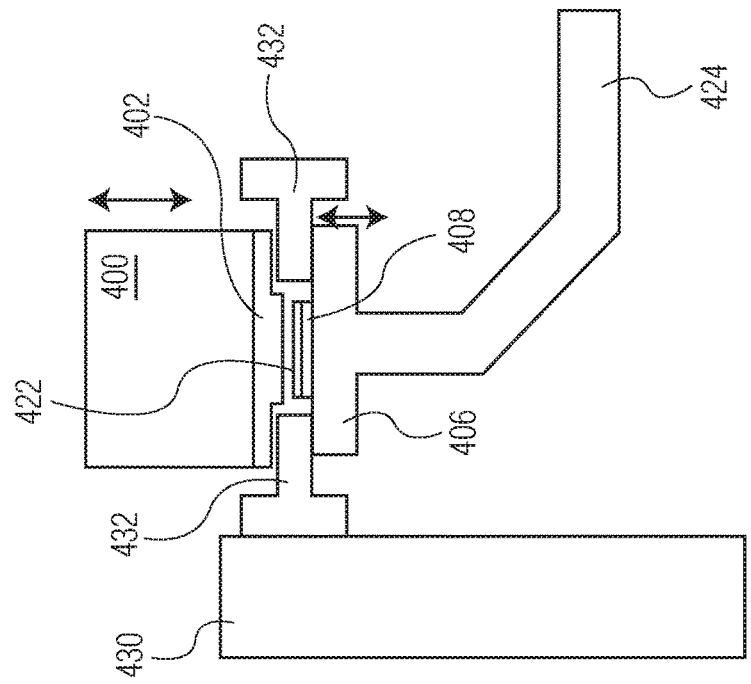
FIGS. 4A-4B are block diagram views of elements of another bonding machine in accordance with an exemplary embodiment of the invention.
Figure 4A:
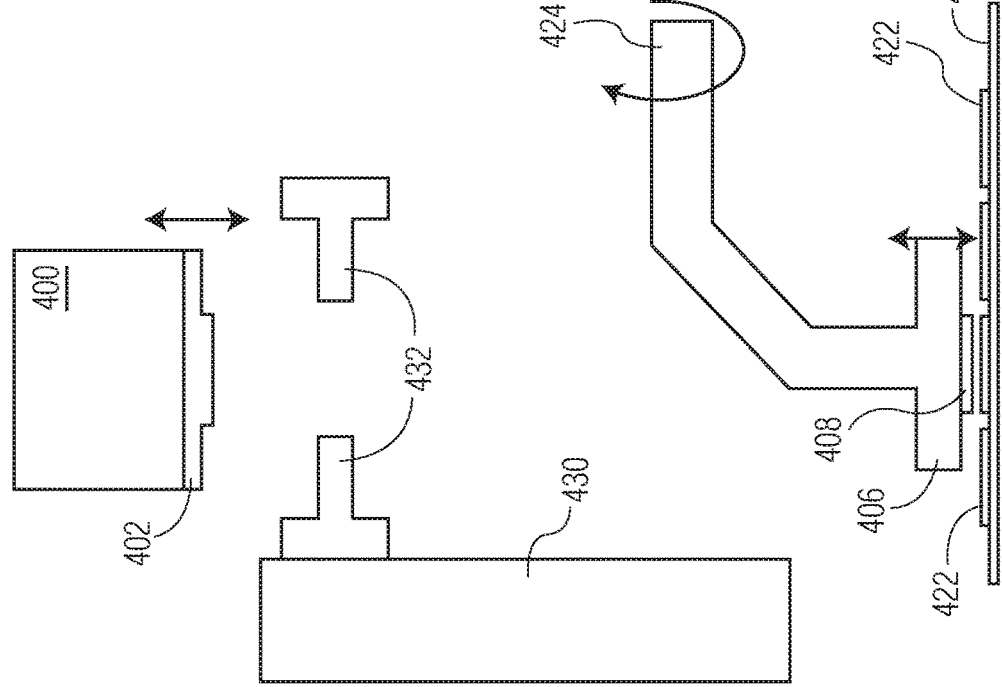

In FIGS. 4A-4B, a spacer 432 is shown secured to a structural component 430 of the bonding machine. A transfer tool 408 (which may be a pick tool) is carried by a structure 406, where structure 406 is carried by a motion system (e.g., including an arm 424) of the bonding machine (where the bonding machine also includes the semiconductor element supply source 420, structure 406 carried by the motion system/arm 424, transfer tool 408, a bond head 400, and other elements not shown for simplicity). In FIG. 4A, the motion system (including arm 424) carries the transfer/pick tool 408 to pick a semiconductor element 422 (e.g., a semiconductor die) from supply source 420, and then moves (e.g., flips) such that semiconductor element 422 is facing a bonding tool 402 carried by bond head 400. Spacer 432 is positioned between bonding tool 402 and transfer tool 408, and is used to set a "gap" between (i) a contact surface of semiconductor element 422 and (ii) a contact surface of bonding tool 402. Transfer tool 408 and bonding tool 402 are aligned with spacer 432 (see FIG. 4B) to set the gap for contactless transfer of semiconductor element 422 from transfer tool 408 to bonding tool 402. After the "gap" is set as shown in FIG. 4B, transfer of semiconductor element 422 may be accomplished, for example, using the technique shown in FIGS. 2A-2E. Specifically, bonding tool 402 may have a structure such as bonding tool 202, and transfer tool 408 may have a structure such as transfer tool 208, as shown in FIGS. 2A-2E (e.g., an arm) of the bonding machine.

In contrast to use of a mechanical mechanism to set the gap (such as shown in FIGS. 3A-3B and FIGS. 4A-4B), other exemplary methods involve driving the transfer/pick tool and/or the bonding/place tool to positions where they do no touch the semiconductor element (e.g., die) at the same time during transfer. More specifically, it is desirable that the transfer tool and the bonding tool are not in contact with the semiconductor element at the same time during transfer of the die from the transfer tool to the bonding tool. Such motion systems desirably are configured with a method of knowing where the tools are. Example options are: (i) sensors on at least one of the transfer and bonding tools (e.g., such as transfer tool 208 and bonding tool 202 in FIGS. 2A-2E, where such sensors are not visible in FIGS. 2A-2E) that can judge the distance between them, such as an optical or capacitive sensor; (ii) calibration of the motion system to know where they need to drive to in order to have the desired gap.

Examples for this option (ii) include: (a) in non-bonding mode, driving the transfer and bonding tools until they touch, memorize those positions, and then during a bonding mode move to positions that are less than that by the desired gap plus a known die thickness; (b) with the pick or place tool, pick up a calibration piece of known thickness, drive them to touch, remember the position, and then use this information to calculate the positions that produce the desired gap; and (c) in a bonding mode, pick up and transfer the semiconductor element (e.g., die) with contact but at a temperature where the NCF is not soft or tacky, and then remember the position for this contact transfer and then in future transfers use a position that leaves a gap and then allows for higher temperatures. Of course, other methods are contemplated.

As will be appreciated by those skilled in the art, any of the aforementioned calibrations (and others within the scope of the invention) may be repeated at intervals (e.g., predetermined intervals such as predetermined time intervals, a predetermined number of bonding operations, etc.).

According to embodiments of the invention transferring the semiconductor element across a gap between (i) a contact surface of the semiconductor element and (ii) a contact surface of the bonding tool, exemplary ranges for the gap are: 1-500 micrometers; 5-500 micrometers; 15-400 micrometers; 30-300 micrometers and 10-100 micrometers.

FIGS. 5A-5B illustrate elements of a bonding machine where the transfer mechanism includes a cooling system 550 for cooling the transfer tool 508. Transfer tool 508 (which may be a pick tool) is carried by a structure 506 including a motion system (e.g., including an arm 524) of the bonding machine (where the bonding machine also includes the semiconductor element supply source 520, the motion system/arm including transfer tool 508, a bond head 500, and other elements not shown for simplicity). In FIG. 5A, the motion system (including arm 524) carries the transfer/pick tool 508 to pick a semiconductor element 522 (e.g., a semiconductor die) from supply source 520, and then moves (e.g., flips) such that semiconductor element 522 is facing a bonding tool 502 carried by bond head 500 as shown in FIG. 5B. Transfer of semiconductor element 522 may be accomplished in a conventional manner (as in FIGS. 1A-1E) or across a gap (as in FIGS. 2A-2E). That is, the "cooled" transfer tool 508 may be used in conventional contact transfer (as in FIGS. 1A-1E), or the inventive contactless transfer (as in FIGS. 2A-2E). For example, transfer tool 508 may be cooled using cooling air provided through cooling system 550 (e.g., dispersed through cooling channels in transfer tool 508) for cooling a contact surface of transfer tool 508. In another example, transfer tool 508 may be cooled using a thermoelectric cooler of cooling system 550 for cooling the contact surface of transfer tool 508. Exemplary temperature ranges for the transfer/pick tool with cooling system 550 at the time of transfer are: −30 to +20 degrees Celsius; −20 to +15 degrees Celsius; and −15 to +10 degrees Celsius. Thus, as will be appreciated by those skilled in the art, cooling system 550 may take a number of forms including but not limited to a forced air based cooling system, a thermoelectric cooling system, passive air cooling, amongst others.

Using certain of the techniques disclosed herein, the temperature of the semiconductor element (e.g., die) at transfer may be increased. Exemplary ranges for the semiconductor element at transfer from the transfer tool to the bonding tool are: 100-160 degrees Celsius; degrees Celsius 115-160; and 130-160 degrees Celsius.

Thus, aspects of the invention relate to processes and mechanisms that provide for transfer of a semiconductor element at higher bonding tool temperatures, where the NCF would deform under the standard transfer conditions. Conventional die transfer involves the NCF not deforming under the force and time of the transfer process. An example force at transfer is about 0.5 to about 10N, and an example transfer time is about 10 to 300 ms. Under these conditions, the NCF is conventionally desirably kept at a temperature so as not to deform.

As provided herein, methods of achieving transfer at higher bond head temperatures include: (1) transfer of the die across a gap, such that the film is not in contact with the transfer/pick tool at the time it becomes in contact with the bonding tool—under these conditions the NCF may be soft at the temperatures of the bonding tool, but deformation does not occur because no force is applied against the transfer/pick tool; (2) establishment of a mechanism and process such that although the bonding tool is at a temperature where the NCF would be soft, there is a substantial temperature gradient from the bonding tool through the die to the NCF—for example, the transfer/pick tool in contact with the NCF may be cooled so that the NCF stays sufficiently hard when the bonding tool is in contact with the opposite site of the die at a temperature where the NCF would normally be soft if it were at that temperature.

The NCF may be considered to be soft (deformed): (1) if the viscosity is less than about 50,000 Poise; (2) if the viscosity is less than about 30,000 Poise; (3) if the viscosity is less than about 20,000 Poise. Of course, these numbers are exemplary in nature, and may vary. According to aspects of the invention, a semiconductor element may be transferred at a bonding tool temperatures where the NCF would normally be soft if it reached the bond head temperature, but it does not, for example, because of transfer across a gap, or a cooled transfer tool.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a bonding machine, the method comprising the steps of:
   (a) carrying a semiconductor element with a transfer tool; and
   (b) transferring the semiconductor element from the transfer tool to a bonding tool of the bonding machine without the transfer tool and the bonding tool contacting the semiconductor element at the same time,
wherein before steps (a) and (b) a calibration step is performed, wherein during the calibration step another semiconductor element including a non-conductive film is transferred from the transfer tool to the bonding tool, wherein during the calibration step the non-conductive film has a viscosity of greater than 20,000 Poise, wherein during the calibration step the transfer tool and the bonding tool contact the another semiconductor element at the same time to provide a relative position between the transfer tool and the bonding tool, wherein after the calibration step the relative position is used for transfer of the semiconductor element to determine a gap between the transfer tool and the bonding tool during step (b).

2. The method of claim 1 wherein the bonding machine is a thermocompression bonding machine, and the bonding tool is a heated thermocompression bonding tool.

3. The method of claim 1 wherein step (b) includes transferring the semiconductor element across a gap between (i) a contact surface of the semiconductor element and (ii) a contact surface of the bonding tool.

4. The method of claim 3 wherein the gap is between 1-500 micrometers.

5. The method of claim 1 wherein the transfer tool is a pick tool used to pick the semiconductor element from a semiconductor element source prior to step (a).

6. The method of claim 1 wherein the semiconductor element includes a non-conductive film on a first side of the semiconductor element, the first side of the semiconductor element being in contact with a contact surface of the transfer tool during step (a).

7. The method of claim 1 wherein step (b) includes providing a vacuum on the bonding tool during the step of transferring.

8. The method of claim 7 wherein step (b) includes providing a positive air supply from the transfer tool toward the bonding tool during the step of transferring.

9. A method of operating a bonding machine, the method comprising the steps of:
(a) carrying a semiconductor element with a transfer tool, the transfer tool including a cooling system for cooling a contact surface of the transfer tool; and
(b) transferring the semiconductor element from the transfer tool to a bonding tool of the bonding machine after step (a) without the transfer tool and the bonding tool contacting the semiconductor element at the same time,
wherein before steps (a) and (b) a calibration step is performed, wherein during the calibration step another semiconductor element including a non-conductive film is transferred from the transfer tool to the bonding tool, wherein during the calibration step the non-conductive film has a viscosity of greater than 20,000 Poise, wherein during the calibration step the transfer tool and the bonding tool contact the another semiconductor element at the same time to provide a relative position between the transfer tool and the bonding tool, wherein after the calibration step the relative position is used for transfer of the semiconductor element to determine a gap between the transfer tool and the bonding tool during step (b).

10. The method of claim 9 wherein the bonding machine is a thermocompression bonding machine, and the bonding tool is a heated thermocompression bonding tool.

11. The method of claim 9 wherein the transfer tool is a pick tool used to pick the semiconductor element from a semiconductor element source prior to step (a).

12. The method of claim 9 wherein the semiconductor element includes a non-conductive film on a first side of the semiconductor element, the first side of the semiconductor element being in contact with a contact surface of the transfer tool during step (a).

13. The method of claim 9 wherein the cooling system includes cooling air for cooling the contact surface of the transfer tool.

14. The method of claim 9 wherein the cooling system includes a thermoelectric cooler.

\* \* \* \* \*